United States Patent
Kubota et al.

(10) Patent No.: US 6,816,182 B2
(45) Date of Patent: Nov. 9, 2004

(54) RADIATION WELDING AND IMAGING APPARATUS AND METHOD FOR USING THE SAME

(76) Inventors: Masanori Kubota, 100 Hobson Dr., Hockessin, DE (US) 19707; Ayako Kubota, 100 Hobson Dr., Hockessin, DE (US) 19707; Munetaka Kubota, 100 Hobson Dr., Hockessin, DE (US) 19707; Alexander Takuma Kubota, 100 Hobson Dr., Hockessin, DE (US) 19707

(*) Notice: Subject to any disclaimer, the term of this patent is extended or adjusted under 35 U.S.C. 154(b) by 72 days.

(21) Appl. No.: 10/266,850

(22) Filed: Oct. 7, 2002

(65) Prior Publication Data

US 2003/0090562 A1 May 15, 2003

Related U.S. Application Data

(63) Continuation-in-part of application No. 10/090,920, filed on Mar. 5, 2002, now abandoned, which is a continuation of application No. 09/625,355, filed on Jul. 25, 2000, now Pat. No. 6,369,845.
(60) Provisional application No. 60/189,229, filed on Mar. 14, 2000.

(51) Int. Cl.[7] ................................................. B41J 27/00
(52) U.S. Cl. ...................................... 347/258; 347/244
(58) Field of Search .............................. 347/241, 244, 347/256, 258; 427/541; 219/121.14; 438/585; 359/205

(56) References Cited

U.S. PATENT DOCUMENTS

| | | | |
|---|---|---|---|
| 3,560,291 A | | 2/1971 | Foglia et al. ................ 156/229 |
| 3,566,071 A | * | 2/1971 | Matchett et al. ........ 219/121.14 |
| 3,900,593 A | * | 8/1975 | Herczog et al. ............. 427/541 |
| 4,456,490 A | * | 6/1984 | Dutta et al. .................. 438/585 |
| 4,636,609 A | | 1/1987 | Nakamata ............... 219/121.64 |
| 4,940,314 A | | 7/1990 | Hecht .......................... 359/276 |
| 5,103,074 A | | 4/1992 | Watanabe et al. ....... 219/121.68 |
| 5,247,180 A | | 9/1993 | Mitcham et al. ......... 250/492.1 |
| 5,296,958 A | | 3/1994 | Roddy et al. ............... 359/204 |
| 5,384,618 A | | 1/1995 | Schurman et al. ............ 355/32 |
| 5,385,092 A | | 1/1995 | Lewis et al. ................. 101/467 |
| 5,506,614 A | | 4/1996 | Fisli ............................ 347/241 |
| 5,557,315 A | | 9/1996 | Meyers et al. .............. 347/244 |
| 5,580,698 A | | 12/1996 | Anderson .................... 430/308 |
| 5,589,870 A | | 12/1996 | Curry et al. ................. 347/233 |
| 5,625,403 A | | 4/1997 | Hazman ...................... 347/239 |
| 5,719,617 A | | 2/1998 | Takahashi et al. .......... 347/241 |
| 5,781,225 A | | 7/1998 | Syracuse et al. ............ 347/258 |
| 5,785,651 A | | 7/1998 | Kuhn et al. ................. 600/310 |
| 5,838,480 A | * | 11/1998 | McIntyre et al. ........... 359/205 |
| 5,840,147 A | | 11/1998 | Grimm .................... 156/272.2 |
| 5,843,265 A | | 12/1998 | Grimm .................... 156/273.7 |
| 6,118,574 A | | 9/2000 | Imanishi et al. ............. 359/305 |
| 6,369,845 B1 | | 4/2002 | Kubota et al. .............. 347/258 |

FOREIGN PATENT DOCUMENTS

| | | |
|---|---|---|
| JP | S55-103920 | 8/1980 |
| JP | S60-229737 | 11/1985 |
| JP | H10-100259 | 8/1998 |
| WO | WO99/28789 | 6/1999 |

\* cited by examiner

*Primary Examiner*—Hai Pham
(74) *Attorney, Agent, or Firm*—RatnerPrestia (57) ABSTRACT

An optical system for joining a first article having a composition and a second article having a composition at an interfacial surface between the first article and the second article, the optical system comprising: a radiation source for providing a radiant energy beam for joining the first article and the second article at the interfacial surface; and a first optical device for controlling a depth of focus of the radiant energy beam, the depth of focus corresponding to a depth of a joint between the first article and the second article at the interfacial surface, said first optical device controlling the depth of focus as a function of the composition of the first article and the composition of the second article.

12 Claims, 7 Drawing Sheets

Prior Art

RADIATION WELDING AND IMAGING APPARATUS AND METHOD FOR USING THE SAME

CROSS REFERENCE TO RELATED APPLICATIONS

This application is a continuation-in-part of U.S. patent application Ser. No. 10/090,920, filed on Mar. 5, 2002 now abandoned which is a continuation of U.S. patent application Ser. No. 09/625,335, filed on Jul. 25, 2000 (issued as U.S. Pat. No. 6,369,845 on Apr. 9, 2002), which claims the benefit of Provisional Application No. 60/189,229 filed Mar. 14, 2000.

TECHNICAL FIELD

The present invention relates, in general, to joining articles using electromagnetic radiation, and more specifically, to welding polymeric articles using electromagnetic radiation through optical aberration.

BACKGROUND OF THE INVENTION

Various methods of using laser irradiation for thermoplastic welding are known in the art. For example, lasers that emit radiation in the infrared spectral region have been used for thermoplastic welding. As such, several companies have commercialized thermoplastic laser welding systems.

Laser welding has numerous advantages over alternative welding technologies. These advantages include repeatability, welding without surface contact, flexibility in the welding approach, residue free welding, and precision in the welding operation. Another potential advantage of laser welding is that it is possible to minimize distortion of a fragile medium caused by other welding techniques using vibration, heat, or chemicals, thereby maintaining the finished appearance of the medium.

For example, monochromatic radiation can be used to accurately control high resolution welding of small and complex polymer products. These polymer products absorb electromagnetic energy and heat up like a transducer. Polymers have a high heat capacity, poor thermal conductivity, and good infrared absorption characteristics, and as such, they are easy to heat up when they are irradiated with infrared energy.

Figure 6:
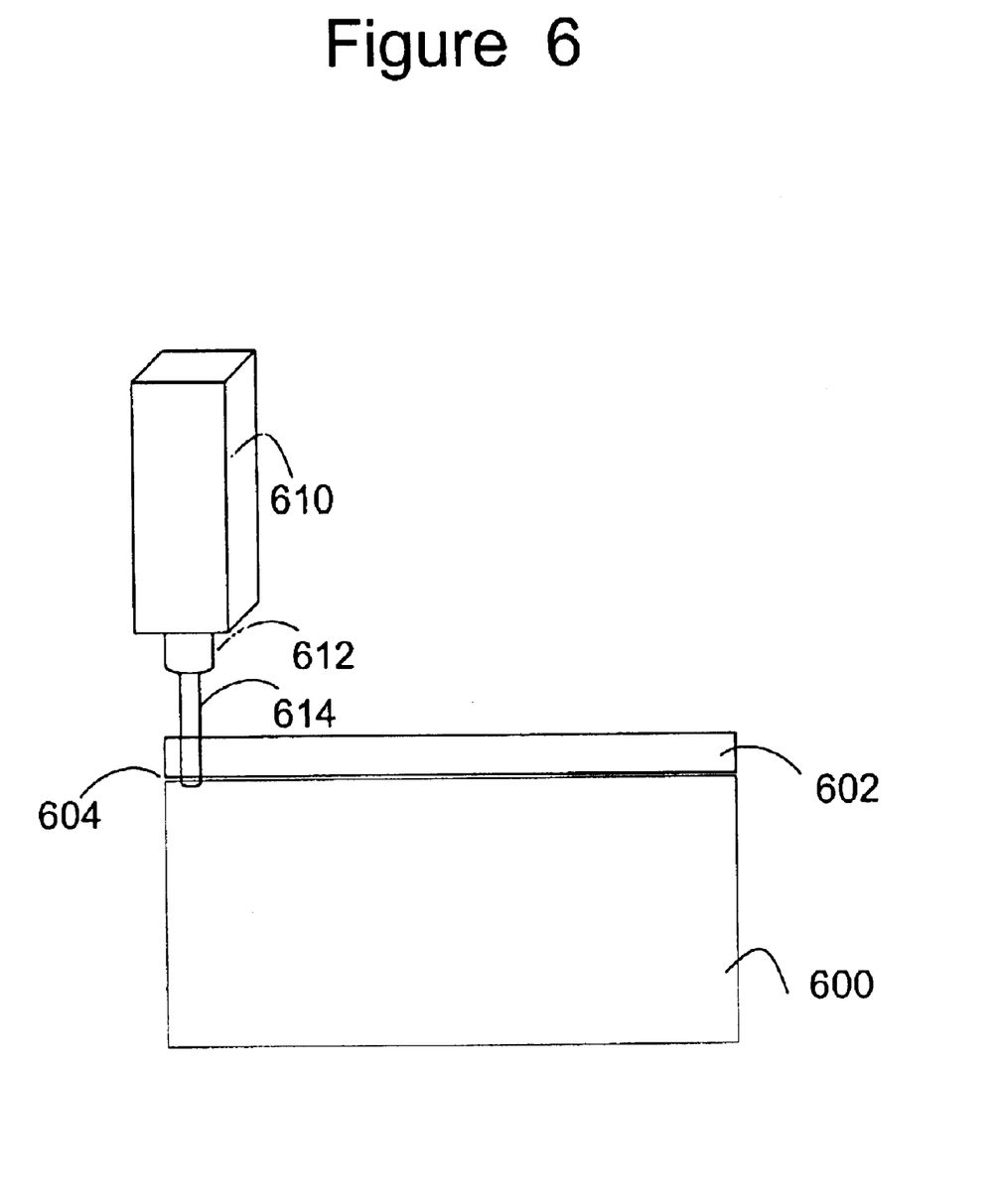
FIG. 6 illustrates a conventional optical system for joining two articles.

FIG. 6 illustrates a conventional laser welding system that is used for joining a first article (substrate 600) and a second article (three-dimensional polymeric layer 602). Substrate 600 and three-dimensional polymeric layer 602 are joined at an interfacial layer 604 between substrate 600 and layer 602.

This system includes a laser 610. Laser 610 utilizes an infinite focal point exposing system. As such, the system has no focal point and the laser beam size is controlled by the set of lenses called beam expanders. Laser 610 emits laser beam 614 through projection lens 612. Laser beam 614 is transmitted towards interfacial layer 604. Problems associated with this type of polymer welding system include poor bonding of polymeric layer 602 and substrate 600, upper surface destruction of the polymeric layer 602, and thermal distortion issues.

Referring again to FIG. 6, laser beam 614 may be scanned across interfacial layer 604 to join substrate 600 and polymeric layer 602. In FIG. 6, the beam is shown at the left hand side of interfacial layer 604. For example, in the joining process, laser beam 614 may be scanned from left to right. Throughout this application, this left to right direction will be considered to be the y-axis of the transmitted light; however, the light may be scanned across any axis.

Figure 7:
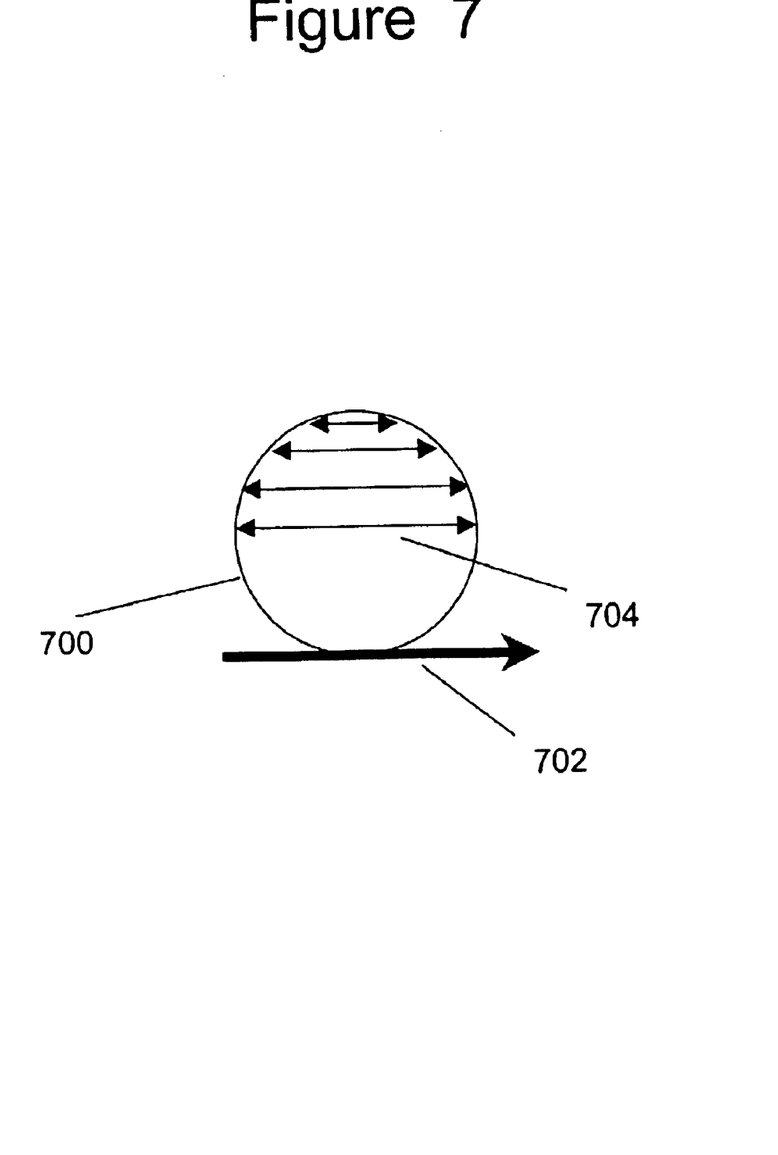
FIG. 7 illustrates a conventional radiant energy beam for scanning.

FIG. 7 shows a typical profile of laser beam 614. Laser beam 614 has a substantially round shape 700. As such, laser beam 614 has a cross dimension that is longer at the center (dimension 704) than at other portions of the beam, such as the edges. This longer center dimension results in a longer exposure time when scanning the laser beam in the x-axis direction 702 across the plane of layer 604. This increased exposure time results in a non-uniform energy distribution, adversely affecting the quality of the weld at the interfacial surface.

Another problem with typical laser welding systems is that the laser light has a Gaussian beam structure. This means that the center of the circle (in a circular shaped light beam as in FIG. 7) has a greater energy density than the edges of the circle. This results in a non-uniform distribution of energy because of the relatively high energy density at the center, and the relatively low energy density at edges of the beam. When this non-uniform energy density is coupled with the non-uniform exposure time described above, the quality of the weld is adversely affected.

Lasers have other shortcomings when used for polymeric welding. Polymeric media often have broad spectral irradiation sensitivity and absorb monochromatic radiation with relatively low quantum efficiency. High laser intensity is required to combat the low quantum efficiency and can cause decomposition or distortion of the top surface media.

Conventional laser welding systems, such as the system illustrated in FIG. 6, typically use two types of polymeric materials. The first material is a laser transparent polymer that is placed on top of a second material that is a laser transducer polymer that absorbs the laser light. The laser light source is projected via optics through the laser transparent polymer layer onto the laser transducer polymer layer. The transducer polymer layer absorbs the radiation and is heated to above the melting point of both polymers, causing melting of the polymeric layer 602 and the substrate 600 to form a bond at the polymer interface. For example, referring to FIG. 6, substrate 600 is a laser transducer polymer that absorbs the laser light, while polymeric layer 602 is a laser transparent polymer.

Conventional laser welding systems typically use a cylindrical laser beam profile as shown in FIG. 6 to irradiate the polymer interface. An issue associated with this conventional system is that the laser delivers greater energy at the surface of the polymeric layer 602 than delivered to the polymer interface 604. In some cases, the transparency of the polymeric layer 602 is insufficient and the laser heat damages the surface of polymeric layer 602. Also, heat absorption increases with an increase in thickness of the polymeric layer 602, limiting the thickness of the polymer that can be used in conventional laser welding. Conventional laser welding is typically limited to polymers with high transparency to delivery sufficient heat to the interface to achieve a high quality bond without burning or distorting the surface of the polymeric layer 602.

The practical implications of insufficient melting of the polymeric interface include poor bonding, poor sealing, and inconsistent welding quality. The laser must be carefully focused and accurately controlled to irradiate the small spot at the interface of the polymers to create a quality weld point. A weak weld spot may be formed if the two polymers are not in direct contact at the interface, causing poor welding strength or consistency.

As such, typical through-transmission polymer welding technologies use an infrared laser as the energy source, high infrared transmission polymeric media such as amorphous resin for the top surface (e.g., polymeric layer 602), and transducer polymeric media containing carbon black or infrared absorbers for the bottom surface (e.g., substrate 600).

In summary, known polymeric welding technologies suffer from several deficiencies. For example, the laser beam (e.g., beam 614) has substantially the same energy density at the top of polymeric layer 602 as it does when it reaches interface 604. Actually, the energy density is often higher at the top of polymeric layer 602 than at interface layer 604 because polymeric layer 602 absorbs some energy. As such, surface burning and carbonation of the top surface of the top surface of polymeric layer 602 results. Further, poor bonding often results between polymeric layer 602 and substrate 600. Further still, two distinct materials are typically used for the bonding, for example, laser grade high infrared transmittance amorphous resin for polymeric layer 602, and infrared heat transducer impregnated resin for substrate 600. This results in two distinct high cost materials being used for the bonding.

Further, conventional welding methods often use a transducer coating at interfacial layer 604, resulting in an increased processing time and cost. Further still, because of the lack of irradiation across the interfacial layer 604, the typical molded polymeric surfaces, having poor mechanical precision, can not provide an adequate weld. Furthermore, typical polymers used in the welding process have a very narrow process temperature window, resulting in gases being released, and carbonation occurring.

As such, it would be very desirable to provide a welding system that is simple, cost efficient, and that provides a quality weld at the interfacial surface of two polymeric articles.

SUMMARY OF THE INVENTION

To meet this and other needs, and in view of its purposes, an exemplary embodiment of the present invention provides an optical system for joining a first article having a composition and a second article having a composition. The optical system is used to join the first article and the second article at an interfacial surface between the first article and the second article. The optical system includes a radiation source for providing a radiant energy beam for joining the first article and the second article at the interfacial surface. The optical system also includes a first optical device for controlling a depth of focus of the radiant energy beam. The depth of focus corresponds to a depth of a joint between the first article and the second article at the interfacial surface. The first optical device controls the depth of focus as a function of the composition of the first article and the composition of the second article.

In another exemplary embodiment of the present invention, a method of joining a first article having a composition and a second article having a composition is provided. The method relates to joining the first article and the second article at an interfacial surface between the first article and the second article using a radiation source. The method includes a step of providing a radiant energy beam from the radiation source for joining the first article and the second article at the interfacial surface. The method also includes a step of controlling a depth of focus of the radiant energy beam as a function of the composition of the first article and the composition of the second article. The depth of focus corresponds to a depth of a joint between the first article and the second article at the interfacial surface.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures.

DETAILED DESCRIPTION OF THE INVENTION

Various apparatuses and methods of irradiating a surface using a radiant energy source are disclosed in U.S. Pat. No. 6,369,845, and U.S. patent application Ser. No. 10/090,920, which are both incorporated herein by reference for their teachings in the art of irradiation of a surface using a radiant energy source.

As indicated above, one problem with conventional optical welding systems is that the laser beam (e.g., beam 614) has substantially the same or a greater energy density at the top of polymeric layer 602 as it does when it reaches interfacial layer 604. As such, the top surface of polymeric layer 602 may become burned, scarred, or otherwise damaged.

To reduce the damage done to the to surface of the polymeric layer, it is desirable to reduce the energy density of the radiant energy beam at the top of the polymeric layer while maintaining sufficient energy density at the interfacial layer to cause bonding.

Figure 5A:
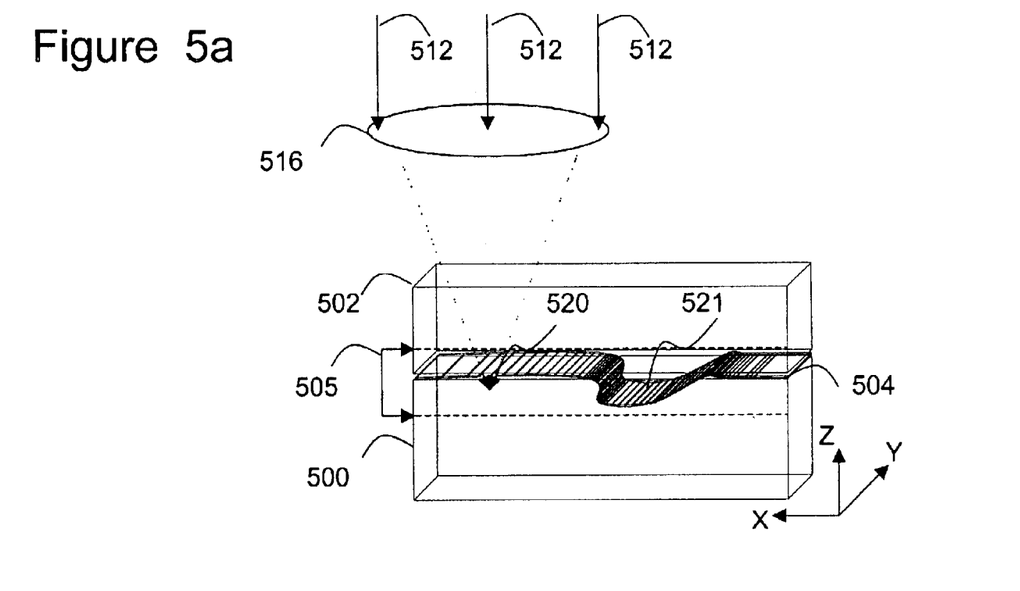
FIG. 5a illustrates an optical system in accordance with an exemplary embodiment of the present invention.

FIG. 5a illustrates an exemplary embodiment of the present invention for reducing the damage to the top surface of the polymeric layer 502. As shown in FIG. 5a, light beam 512 transmitted from a radiant energy source (not shown) is provided for transmitting light towards optical lens 516. As such, light beam 512 illuminates three-dimensional polymeric layer 502, which is in contact with a substrate 500. Because light from light beam 512 is transmitted through optical lens 516, the light is transmitted towards interfacial layer 504 in a substantially triangular shape (cone-shaped), in contrast to light beam 614 in FIG. 6, which is a substantially linear shaped (rectangular shaped) beam of light. Because the light from light beam 512 is transmitted in this triangular configuration, the energy density at the top surface of polymeric layer 502 is less than the energy density at interfacial layer 504. As such, any damage done to the top surface of polymeric layer 502 is substantially reduced, if not eliminated.

This approach of providing a low energy density at the top surface of the polymeric layer, and a higher energy density at the welding point (the interfacial layer), is accomplished in various exemplary embodiments of the present invention using a single axis cone shaped beam structure transmitted against the scanning direction of the radiant energy beam.

Referring again to FIG. 5a, light beam 512 transmitted from a radiant energy source is focused at a single focal point 520 at interfacial layer 504 for welding the polymeric medium. As such, this system may not provide control of the depth of irradiation at the interfacial zone 505, and accordingly, in some applications, may not provide an adequate weld between polymeric layer 502 and substrate 500.

According to various exemplary embodiments of the present invention, to control the depth of irradiation at the interfacial zone, it is desirable to use optical aberration on the radiant energy beam that illuminates the polymer interface.

Figure 5B:
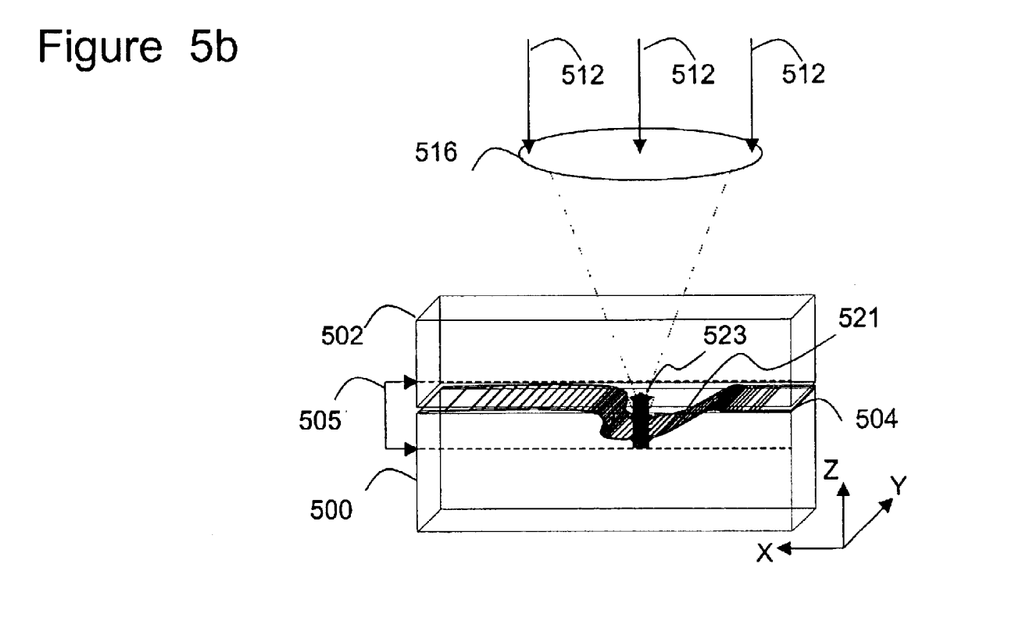
FIG. 5b illustrates another optical system in accordance with an exemplary embodiment of the present invention.

FIG. 5b illustrates an exemplary embodiment of the present invention for producing discrete focal point irradiation at the interfacial zone 505. As shown in FIG. 5b, light beam 512 transmitted from a radiant energy source (not shown) is provided for transmitting light towards optical lens 516. Optical lens 516 induces optical aberration in light beam 512, thereby producing discrete focal point irradiation 523 at the interfacial zone 505. The discrete focal point irradiation 523 heats the polymeric layer 502 and substrate 500 within the interfacial zone 505 to their melting points. The depth of irradiation of the interfacial zone 505 is chosen to include all the physical distortions at the interfacial layer 504 of the two polymeric surfaces. The two heated polymers bond across distortion areas 521 where the polymers do not come into physical contact, producing a high quality weld.

Monochromatic light sources such as lasers have optical devices configured to focus to a single two-dimensional focal point, which prevents exposure of the polymeric material through the depth of interfacial zone 505. As detailed below, various exemplary embodiments of the present invention utilize optical aberration provided by unconventional optical devices to modify the radiant energy (e.g., laser light) into a discrete focal point distribution. The aberration of the laser light (or other radiant energy) enables exposure of the polymeric material through the depth of interfacial zone 505, thereby producing high quality welding results.

Therefore, it is an object of the present invention to provide an illumination method by which monochromatic light intensity can be distributed in a three-dimensional focal point onto polymeric media.

The above object is obtained by exposing a three-dimensional polymeric media with a radiant energy welding system (e.g., a laser welding system). The welding system includes a radiation source, an optical filter, and lenses along with the polymeric media to be joined. The method includes aligning the radiant energy beam with a system of optical devices (e.g., filters, spherical lenses, cylindrical lenses, parabolic mirrors, ellipsoidal mirrors, etc.). The radiant energy beam passes through aberration inducing optical devices and exposes the polymeric medium with electromagnetic irradiation. The aberration induced onto the radiant energy beam may be any type of aberration, for example, coma aberration, spherical aberration, astigmatism, field curvature, distortion, and chromatic aberration.

The method of illuminating polymeric material offered by the present invention exploits the properties of monochromatic light in forming SEIDEL's aberrations when focused. As used herein, the term "monochromatic light" refers to light of a single wavelength, such as light generated by a laser source.

Polychromatic light sources give rise to chromatic aberrations, which are caused by the differences in refraction of the various wavelengths of the spectrum. Shorter wavelengths have greater indices of refraction than longer wavelengths and this causes wavelengths of different energy to separate upon refraction by a lens.

Figure 1:
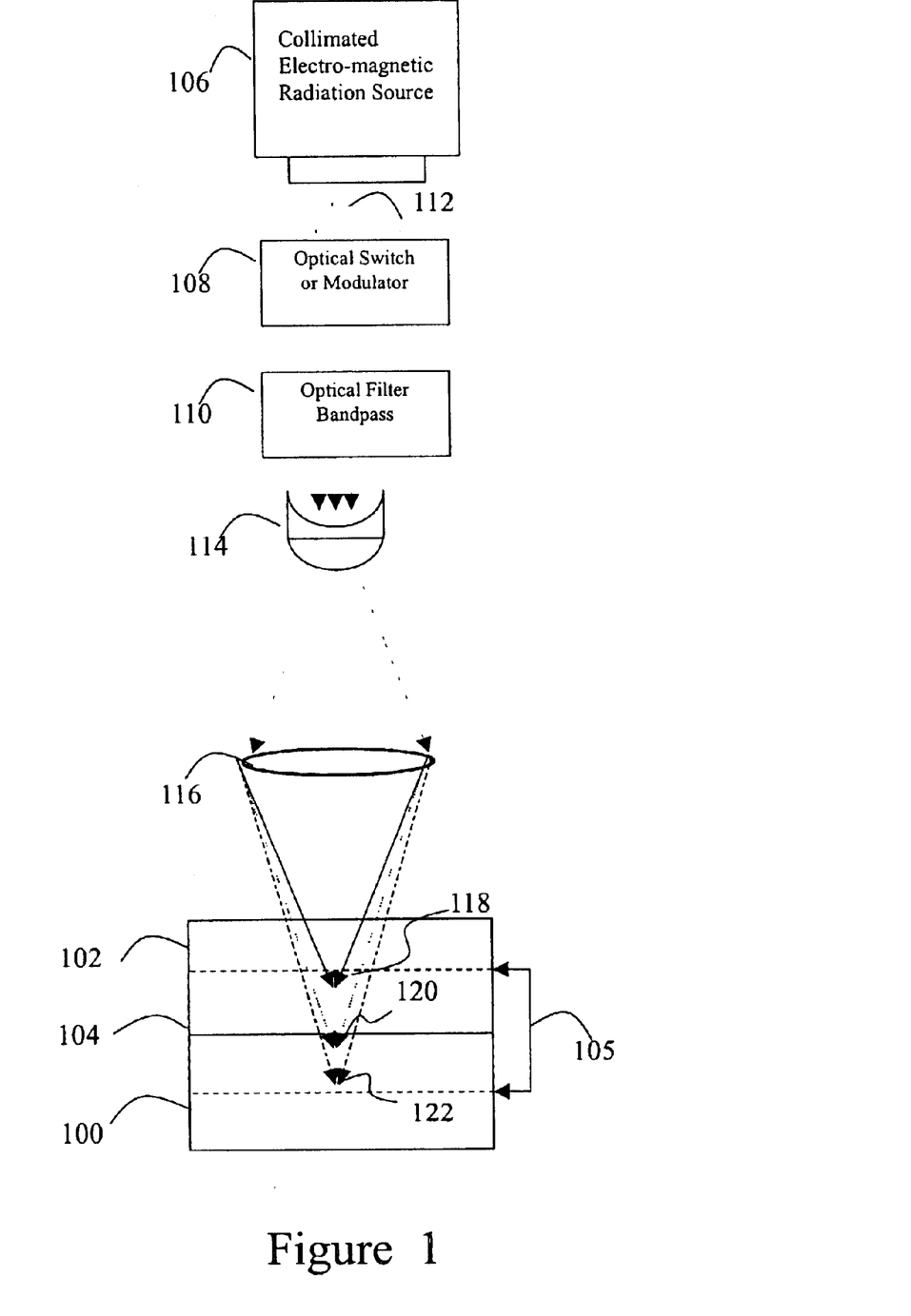
FIG. 1 illustrates an optical system in accordance with an exemplary embodiment of the present invention.

Briefly, FIG. 1 illustrates a system for joining a first article 100 (e.g., substrate 100) and a second article 102 (polymeric layer or polymeric media 102) at an interfacial layer 104 between first article 100 and second article 102. The system includes a radiation source 106 for providing a radiant energy beam 112 for joining first article 100 with second article 102 at interfacial layer 104. Radiant energy beam 112 is transmitted from radiation source 106 to optical switch (alternatively modulator) 108. Radiant energy beam 112 is transmitted from optical switch 108 to optical filter 110, and then to optical device 114 (e.g., a lens), and then to optical device 116 (e.g., a lens). Radiant energy beam is then transmitted, in a substantially cone-shaped configuration, towards second article 102 and first article 100.

In this exemplary embodiment of the present invention, radiation source 106 is a polychromatic light source. Polychromatic light source 106 gives rise to chromatic aberrations, as explained above. Therefore, a number of focal points (and as such, a depth of focus) are provided in first article 100 and second article 102. Three such focal points 118, 120, and 122 are shown in FIG. 1. The focal depth results in irradiation through interfacial zone 105 such that a quality weld is formed between first article 100 and second article 102. By irradiating interfacial surface 104 and interfacial zone 105 with the focal points, surrounding materials are melted, and as such, first article 100 and second article 102 are joined.

Various features of the joining system illustrated in FIG. 1 will now be explained in greater detail. Radiation source 106 may be any type of source that may be used to irradiate an interfacial layer between a first article and a second article. In the embodiment described above, radiation source 106 is a collimated electromagnetic radiation source, more specifically, a polychromatic light source. Polychromatic light source 106 transmits radiant energy beam 112 towards an optical switch or modulator 108 (hereinafter referred to simply as optical switch 108) for recording an image on the polymeric layer 102, and more specifically, for controlling the beam intensity or to turn the radiant energy beam 112 on and off.

For example, polychromatic light source 106 may be selected to compliment the spectral sensitivity of the recording media (first article 100 and/or second article 102) and the required size of the writing spot (the bond/weld needed to join the articles). In many joining systems, light sources that emit light in the ultraviolet to infrared regions may be used, for example, the L2274 Quartz Xenon light source manufactured by Hamamatsu Photonics, Inc.

In an exemplary embodiment of the present invention, optical switch 108 is a Model LS055, designed to emit light in the infrared region, manufactured by nm Laser Products, Inc. Optical switch 108 may be modified according to wavelength region and range specifications. The filter 110 may be selected to correspond to the characteristics of the light source 106, spectral characteristics of polymeric layer 102, media thickness and the required size of the writing spot. In an exemplary embodiment of the present invention, filter 110 is a Model BP-1500-090-B and NB-0930-035-A, a bandpass filter for the infrared region, manufactured by Spectrogon. Filter 110 may be modified according to characteristics of the light source 106, spectral characteristics of polymeric layer 102, media thickness and the required size of the writing spot.

As indicated above, light beam 112 is transmitted through optical switch 108 and optical filter (e.g., a bandpass filter) 110. Light beam 112 is then transmitted through optical device 114, for example, an achromatic lens 114, and optical device 116, for example, another optical lens. The combination of optical filter 110, achromatic lens 114, and lens 116 is often called a beam shaper. The beam shaper minimizes unevenness of an energy profile by modifying a beam shape. The optical devices (e.g., lenses 114 and 116) adjust the incident radiant energy beam dimension to control the beam energy profile and the amount of chromatic and spherical aberration. A large beam projected through a lens and focused to a small spot generates a greater magnitude of optical aberration.

An incident radiant energy beam may have a gaussian energy profile with greater energy density in the center of the beam versus the energy density at the edges of the radiant energy beam. Spherical aberration can be introduced in the optics to normalize the energy distribution profile. Achromatic lenses 114 and 116 align the incident radiant energy beam while correcting for chromatic aberration, as desired. Various achromatic lenses are known in the art, and are commercially available from many manufacturers, such as Nikon, Hoya and Edmund Scientific Co. In an exemplary embodiment of the present invention, the achromatic lenses 114 and 116 are made with a focal point distance of 100 mm, and were made with BK7-SF5 glass. Achromatic optics are typically constructed using a combination of a high index refraction lens and a low index refraction lens. Some typical material combinations for use in making achromatic lenses are: BaF10-FD10, BaFN10-SF57, SSKN8-FD10, SSKN8-SF10, F2-K5-F2, F2-BK7-F2, in addition to other combinations.

Achromatic optical devices produce a radiant energy beam (e.g, a light beam) for the illumination application that includes all wavelengths of the light source emission in the same wavefront. Referring again to the system illustrated in FIG. 1, achromatic lens 116 is used to focus the beam from achromatic lens 114. Achromatic lenses are commonly used as focusing lenses and are readily available at a low cost. In another exemplary embodiment of the present invention, a combination of a Plano-Convex (PCX) single lens and an achromatic lens made with the combination of Plano-Convex (PCX) Plano-Concave (PCV) made from BK7 and SF5 glass with a focal point distance of 50 mm is used for optical device 116.

Achromatic optical devices are not fully corrected for chromatic and/or spherical aberration, and as such, in a selected wavelength range the various wavelengths of light are focused at the various respective and discrete focal points 118, 120, and 122, as described above. The achromatic lens 116 is selected so that it focuses the light 112 such that the spectral emission of the light source is focused around interfacial layer 104 of polymeric layer 102 and substrate 100 throughout the depth of the polymeric layer 102, and into substrate 100.

As such, the chromatic aberration effect of achromatic lens 116 spreads the focal point of the light so that the light penetrates below the surface of the polymeric layer 102. The shorter wavelengths are focused closest to achromatic lens 116, below the surface of the polymeric layer 102, as shown in FIG. 1. The focal points of the increasingly longer wavelengths penetrate further below the surface into the polymeric layer 102. The optical devices are selected to project light with continuous focal points of increasingly longer wavelengths to irradiate interfacial zone 105. The condensed radiation energy heats up and melts the polymeric media below the surface of polymeric layer 102 and throughout the interfacial zone 105 to bond polymeric layer 102 to substrate 100.

The longer wavelengths of light penetrate well below the top surface of the recording material (the top surface of polymeric layer 102) because of two complimentary phenomena; first, the longer focal points due to the chromatic aberration effect discussed above; second, the reflection properties for longer wavelengths as compared to shorter wavelengths of light. Radiation of longer wavelengths exhibits less reflectance off the surface of the polymeric layer 102 than do shorter wavelengths. As the reflectance decreases, more radiation penetrates below the surface of the polymeric layer 102.

In addition to the above mentioned optical phenomena that support the use of polychromatic light sources in exposing polymeric material, the use of polychromatic light benefits from the quantum efficiency in the absorption phenomenon. Polychromatic light sources provide a distribution of energy that can be optimized to substantially overlap with the absorption profile of the polymeric material. An energy distribution, in contrast to monochromatic radiation, utilizes a variety of potential absorbers in the polymeric material. Since quantum absorbers of various energy levels contribute to thermal absorption, lower intensity of polychromatic light provides more extensive exposure as compared to higher intensity of monochromatic light. Due to the improved quantum efficiency provided with polychromatic light sources, poor welding quality due to quantum saturation of the polymeric material is substantially avoided.

Spherical aberration occurs when light waves passing through the periphery of a lens are not brought into focus with light waves passing through the center of the lens. Waves passing near the center of the lens are refracted only slightly, whereas waves passing near the periphery are refracted to a greater degree, resulting in the production of different focal points along the optical axis. Waves passing near the center of the lens focus at longer distances than waves passing near the periphery of the lens. Therefore, as a light beam passes through an optical device with spherical aberration the beam generates a series of discrete focal points along the optical axis. A large beam dimension passing through a small lens generates a greater magnitude of spherical aberration. Gaussian light, having a higher energy density at the center of a beam, penetrates deeper into the media before being focused; however, the media at the center of the light beam may be preheated. As such, the overall focused energy profile in the direction of the optical axis (e.g., the Z-direction) is substantially balanced at the discrete welding zone.

Figure 2:
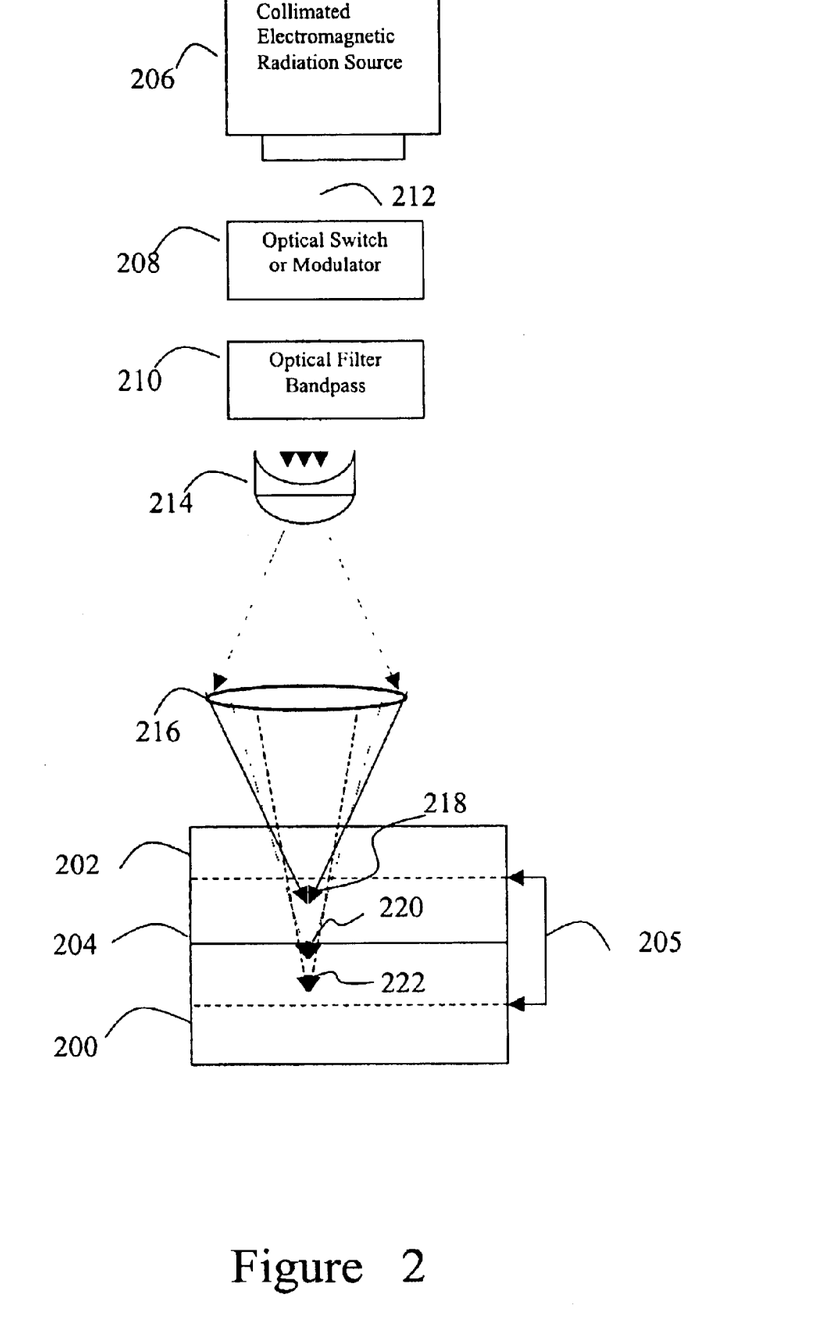
FIG. 2 illustrates another optical system in accordance with an exemplary embodiment of the present invention.

Similar to FIG. 1, FIG. 2 illustrates a system for joining a first article 200 (e.g., substrate 200) and a second article 202 (polymeric layer or polymeric media 202) at an interfacial layer 204 between first article 200 and second article 202. The system includes a radiation source 206 for providing a radiant energy beam 212 for joining first article 200 with second article 202 at interfacial layer 204. Radiant energy beam 212 is transmitted from radiation source 206 to optical switch 208. Radiant energy beam 212 is transmitted from optical switch 208 to optical filter 210, and then to optical device 212, and then to optical device 216. Radiant energy beam 212 is then transmitted, in a substantially triangular configuration, towards second article 202 and first article 200.

In this exemplary embodiment of the present invention, the depth of focus is controlled by controlling spherical aberrations related to radiant energy beam 212 transmitted through optical devices, such as optical devices 214 and 216. Because of the spherical aberrations, a number of focal points (and as such, a depth of focus) are provided in first article 200 and second article 202. Three such focal points 218, 220, and 222 are shown in FIG. 2. The focal depth results in irradiation of the interfacial layer 204 and the interfacial zone 205 such that a quality weld is formed between first article 200 and second article 202.

The exemplary embodiment of the present invention described above with respect to FIG. 1 uses chromatic aberrations to control the depth of focus. In contrast, the exemplary embodiment of the present invention described with respect to FIG. 2 uses spherical aberrations to control the depth of focus.

Various features of the joining system illustrated in FIG. 2 will now be explained in greater detail. FIG. 2 illustrates a radiation source 206 (e.g., collimated electromagnetic radiation source 206) that transmits light having optical aberration and multiple focal points that are above, on, and below the surface of polymeric interface 204. FIG. 2 illustrates an exaggerated view of three hypothetical monochromatic light rays passing through optical device 216. In this exemplary embodiment, optical device 216 is a convex lens. Refraction of the peripheral rays is greatest followed by those in the middle and then the rays in the center. The larger refraction by the outermost rays results in a focal point 218 that occurs in front of focal points 220 and 222, that are produced by rays passing closer to the center of convex lens 216. Most of this discrepancy in focal points arises from approximations of the equivalency of sine and tangent values of respective angles calculated using the Gaussian lens equation for a spherical refracting surface.

In an exemplary embodiment of the present invention, radiation source 206 is selected to compliment the spectral sensitivity of the polymeric media (layers 200 and/or 202). For example, radiation source is a monochromatic light source. Typically light sources with emission in the infrared region of the spectrum, such as the SLD2102 system manufactured by Spectron Laser Systems Inc. are used for such a monochromatic light source. Monochromatic light source 206 transmits light beam 212 toward optical switch 208 that is chosen to correspond to the characteristics of the light source 206, and the optical power and desired size of the welding spot.

In an exemplary embodiment of the present invention, optical switch 208 is a Model LS055, designed for infrared transmission, and is manufactured by nm Laser Products, Inc. The laser switch 208 may be modified according to wavelength region and wavelength range specifications.

Referring again to FIG. 2, in an exemplary embodiment of the present invention, modulated monochromatic light beam 212 passes through an imaging system including a beam expander lens 214 (for spreading the light beam to focus on the lens 216) and a projection lens 216. The combination of lens 214 and lens 216 is often called a beam shaper and is used to adjust the width of the beam dimension and beam energy profile. The beam shaper can be configured using both spherical and/or cylinder lenses and other optical components. The optical devices (lenses 214 and 216) adjust the beam dimension to control the beam energy profile and the amount of chromatic and spherical aberration. A large beam projected through a lens and focused to a small spot generates a greater magnitude of optical aberration.

The incident light beam 212 may have a gaussian energy profile with a greater energy density in the center of monochromatic light beam 212 versus a lower energy density at the edges of monochromatic light beam 212. Spherical aberration can be introduced in the optics to normalize the energy distribution profile. Projection lens 216 aligns monochromatic light beam 212 while producing spherical aberration.

In an exemplary embodiment of the present invention, beam expander lens 214 and projection lens 216 are standard lenses in the art and are commercially available from many manufacturers, such as ARW Custom Optical Corp. and Edmund Scientific Co., Inc. The lenses may be made with fused silica glass. A Plano-Convex cylinder lens may also be used.

The optical devices in the system transmit monochromatic light beam 212 for the illumination application that includes all wavelengths of light source emission in the same wavefront. Spherical aberration is introduced when the light passes through projection lens 216. Projection lens 216 focuses monochromatic light beam 212 such that the spectral emission of monochromatic light source 206 is at the various respective focal points 218, 220, and 222 throughout the depth of interfacial zone 205, as illustrated in FIG. 2.

Light passing through a low refractive angle section of a projection lens (e.g., a spherical lens) is focused at a position far from the lens, while light passing through a higher refractive angle section of the projection lens (e.g., a spherical lens) is focused at a position near the lens. Again referring to FIG. 2, the spherical aberration effect from projection lens 216 spreads the focal point penetration in the dimension of the thickness of interfacial zone 205. The light passing through the edge of projection lens 216 is focused closest to projection lens 216, near the surface of the polymeric layer 202. The light passing closer to the center of projection lens 216 penetrates deeper into polymeric layer 202, and even into substrate layer 200. Therefore, a discrete array of light focal points progresses throughout interfacial zone 205, providing a three-dimensional weld.

The use of monochromatic light combined with spherical aberration also benefits from a broader latitude in configuring the optical system design. The three-dimensional energy distribution minimizes the formation of hot spots and increases the physical tolerance for accurate focus on interfacial zone 205. Physical deformations in the surface of polymeric layer 202 and substrate layer 200 may preclude physical contact of these surfaces at interface layer 204. Controlled irradiation of the polymers through the depth of interfacial zone 205 assures quality welding of the polymer layers 202 and 200.

Projection lens 216 may be specified to control the focal point penetration below the top surface of the polymeric layer 202 of polymeric material. The distance between focal points from a monochromatic light source is a function of the optical index of refraction. If a thinner projection lens 216 was selected, a lower index of refraction results than if a thicker projection lens 216 was selected. Control of the lens glass thickness controls the amount of spherical aberration generated by the optical devices. In accordance with present invention, a projection lens system, that may comprise two to three optical elements (e.g., lenses) can be assembled that projects light with a known and controlled amount of optical aberration. The distance between the shortest focal length and longest focal length of the lens may also be optimized using multiple optical components.

Accordingly, through the exemplary embodiments of the present invention explained above with respect to FIGS. 1 and 2, numerous methods of controlling the depth of focus (e.g., chromatic aberrations and spherical aberrations) have been described; however, other exemplary methods and systems for controlling the depth of focus in a joining operation are considered within the scope of the present invention.

Additional exemplary methods and apparatuses of the present invention can be used to control the depth of focus in an imaging or welding operation. For example, the incident radiant energy beam dimension may be controlled by using beam shaper optical devices that are either spherical or cylindrical. Further, the depth of focus may be controlled by selecting the wavelength center of the incident radiant energy beam by using a filter based on the wavelength absorption characteristics of the polymeric media. Further still, the depth of focus may be controlled by selecting the wavelength band-pass of the incident radiant energy beam by using a filter based on the depth of imaging required for bonding the polymeric media, where the filter may be a band-pass filter. Further still, the depth of focus may be controlled by selecting focused angles of the incident radiant energy beam on the polymeric media to control the energy density distribution throughout the media (the focal points having a higher energy density distribution at the media interface than at the media top surface). Further still, the depth of focus may be controlled by selecting the shape and dimension of the incident radiant energy beam transmitted to the projection optics to control the energy density distribution throughout the media, to improve the energy profile of the discrete focal points, and to have a higher energy density distribution at the media interface than at the media top surface.

Figure 3:
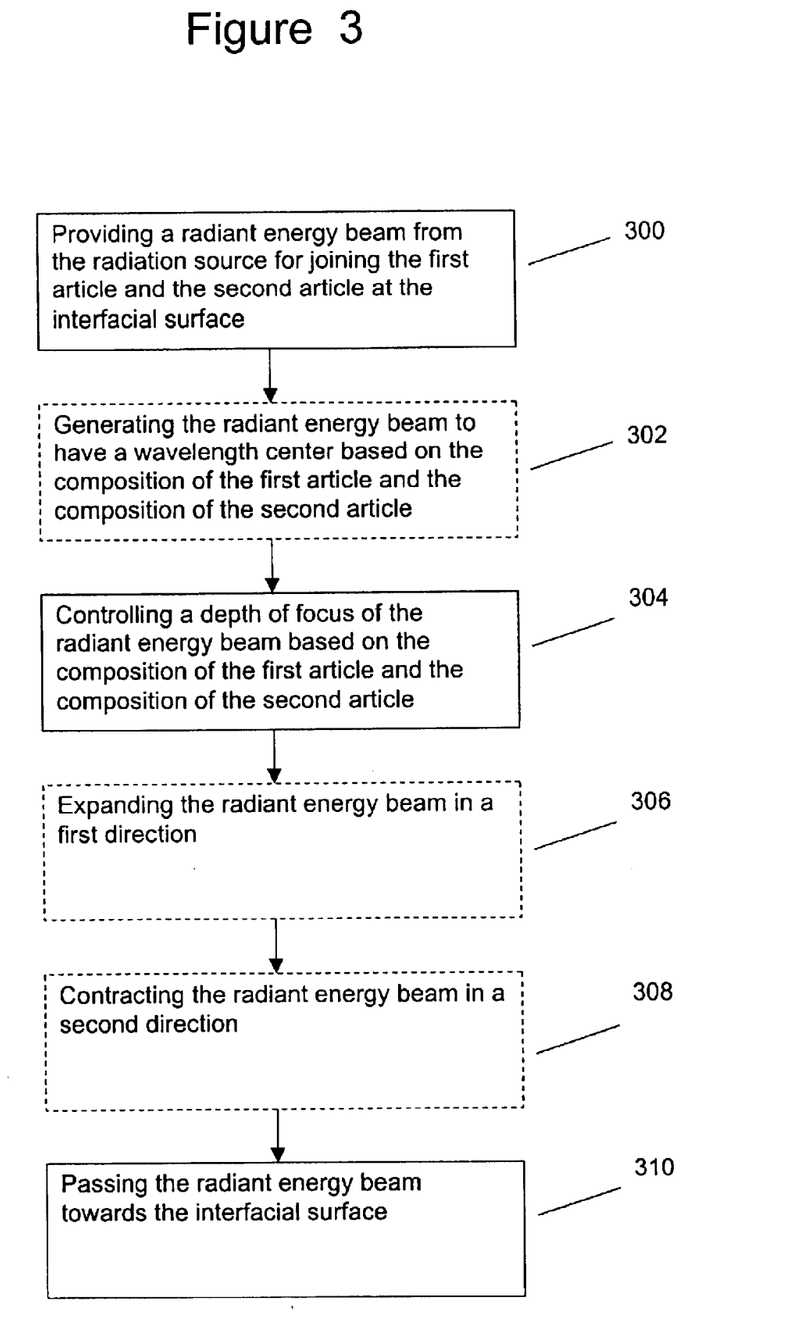
FIG. 3 is a flowchart illustrating a method of joining two articles in accordance with an exemplary embodiment of the present invention.

FIG. 3 is a flowchart illustrating a method of joining a first article (e.g., substrate 100) having a composition and a second article (e.g., polymeric layer 102) having a composition at an interfacial surface (e.g., interfacial surface 104) between the first article and the second article using a radiation source (e.g., light source 106). At step 300 a radiant energy beam is provided from the radiation source for joining the first article and the second article at the interfacial surface. As indicated by the dashed outline, step 302 is an optional step. At step 302, the radiant energy beam is generated to have a wavelength center based on the composition of the first article and the composition of the second article.

At step 304 a depth of focus of the radiant energy beam is controlled based on the composition of the first article and the composition of the second article. The depth of focus corresponds to a depth of a joint between the first article and the second article at the interfacial surface. As indicated by the dashed outlines, steps 306 and 308 are optional steps. At step 306 the radiant energy beam is expanded in a first direction. At step 308 the radiant energy beam is contracted in a second direction, where the second direction is substantially perpendicular to the first direction. At step 310 the radiant energy beam is passed towards the interfacial surface after the steps of expanding and contracting.

As indicated above, typical laser light beams for joining articles at an interfacial surface have a circular shape, as illustrated in FIG. 7. During scanning of the laser beam across the surface to be joined, a non-uniform energy distribution results from the non-uniform scanning time (described in detail in the background of the invention).

Figure 4:
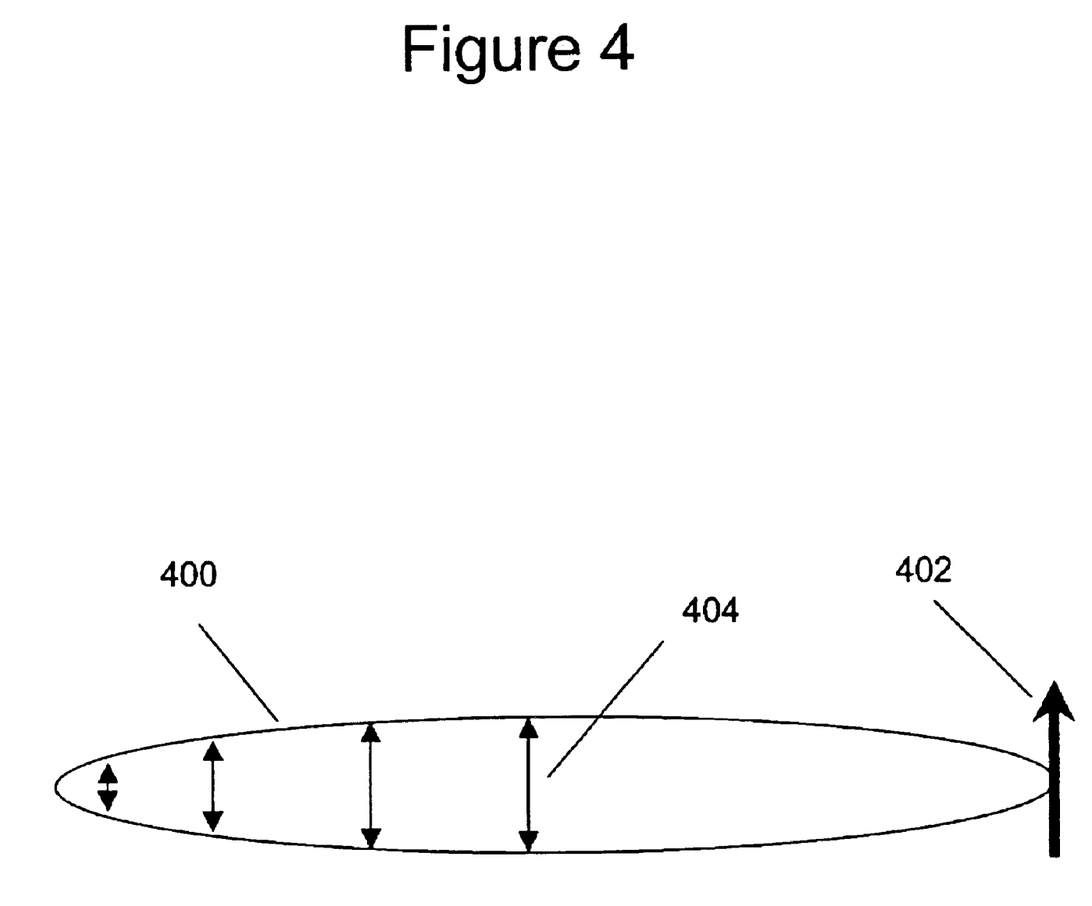
FIG. 4 illustrates a modified radiant energy beam for scanning in accordance with an exemplary embodiment of the present invention.

FIG. 4 of the present invention illustrates a radiant energy beam with an elliptical (substantially linear in the y-axis) shape 400. As such, when the light beam is scanned across the surface to be joined in scanning direction 402 (e.g., in the direction of the x-axis), a more uniform energy distribution results.

In an exemplary embodiment of the present invention, in order to reshape the light beam from a circular beam (as in FIG. 7) to a elliptical or substantially linear shaped beam, the light beam is transmitted through a concave line generator lens as opposed to a typical line generator lens.

Various optical devices can be used as a shaper to reshape the light beam as discussed above. Any device that can transform a dimension of a light beam to a desirable different dimension (for example, to provide a uniform energy distribution) may be utilized.

By having a reduced energy density at the top surface of the polymeric layer, and an increased energy density at the interfacial layer (using a single axis cone shaped beam structure, against the scanning direction, and with the aberration at the focal plain), numerous disadvantages of conventional polymer joining systems are avoided. For example, the extra process of providing a transducer coating at the interfacial layer may be avoided. Further, burning of the top surface of the polymeric layer, and the associated poor bonding of the polymeric layer and the substrate are also significantly reduced, if not eliminated.

Although various exemplary embodiments of the present invention have been described using a light source, or more particularly, a laser light source, the present invention is applicable to any type of electromagnetic radiation source, including, for example, either polychromatic and monochromatic energy sources such as laser lights, high pressure discharge lamps (e.g., a halogen lamp, a xenon lamp, a metal-halide lamp, a mercury lamp), microwave energy, high radio frequency energy, electron beam energy, and high intensity polychromatic light irradiation methods.

Although various exemplary embodiments of the present invention have been described using a collimated energy source, this component is not necessary in various embodiments of the present invention. For example, an external collimator may be used with a non-collimated energy source as the radiant energy source.

Various exemplary embodiments of the present invention have been described using an optical filter; however, such a filter is not necessary in each embodiment of the present invention. For example, if monochromatic energy is used as the radiation source, such an optical filter may not be included.

Various exemplary embodiments of the present invention have been described using a beam shaper; however, such a beam shaper is not necessary in each embodiment of the present invention. For example, if the monochromatic radiation source has a rectangular or non-spherical shape and is non-Gaussian, a beam shaper may not be included in the joining apparatus.

In an exemplary embodiment of the present invention, absorption characteristics of the polymeric media are optimized by mixing an absorbent or absorbents into polymeric media.

Although the exemplary embodiments of the present invention herein described primarily refer to the first article being a substrate, and the second article being a polymeric media or polymeric layer, the first article and the second article may be identical materials. This is an advantage over conventional joining systems, in which the top article had to have transparent properties, and the lower article had to be absorbent. Because of the methods of distributing the energy from the radiant energy beam disclosed herein, both the first article and the second article may be constructed of a transparent medium.

Although various exemplary embodiments of the present invention have been described related to the joining of two polymeric articles, the present invention is applicable to the joining of any two articles that may be joined using radiant energy. For example, the articles may be polymeric media, biological cells, or human tissue. Additionally, various exemplary embodiments of the present invention can be used to expose photosensitive recording media. Further still, various exemplary embodiments of the present invention may be used in conjunction with a deflector system, for example, a raster scanning system such as a drum, a mirror, or any deflector device in the illumination of the recording media or welding media.

Although illustrated and described herein with reference to certain specific embodiments, the present invention is nevertheless not intended to be limited to the details shown. Rather, various modifications may be made in the details within the scope and range of equivalence of the claims and without departing from the spirit of the invention.

What is claimed:

1. An optical system for joining a first article having a composition and a second article having a composition at an interfacial surface between the first article and the second article, the optical system comprising:

a radiation source for providing a radiant energy beam for joining the first article and the second article at the interfacial surface; and a first optical device for controlling a depth of focus of the radiant energy beam, the depth of focus corresponding to a depth of a joint between the first article and the second article at the interfacial surface, said first optical device controlling the depth of focus as a function of the composition of the first article and the composition of the second article, wherein said radiation source selectively generates said radiant energy beam to have a wavelength center as a function of the composition of the first article and the composition of the second article, and said radiation source includes a filter for selectively generating said radiant energy beam to have the wavelength center.

2. The optical system of claim 1 further comprising:

a second optical device for intercepting said radiant energy beam from said radiation source, said second optical device expanding said radiant energy beam in a first direction and contracting said radiant energy beam in a second direction, said first direction being substantially perpendicular to said second direction, said second optical device passing said radiant energy beam towards the interfacial surface.

3. The optical system of claim 1 wherein said first optical device controls the depth of focus by controlling chromatic aberrations of said radiant energy beam.

4. The optical system of claim 1 wherein said first optical device controls the depth of focus by controlling spherical aberrations of said radiant energy beam.

5. The optical system of claim 1 wherein said radiation source is a monochromatic light source.

6. The optical system of claim 1 wherein said radiation source is a polychromatic light source.

7. A method of joining a first article having a composition and a second article having a composition at an interfacial surface between the first article and the second article using a radiation source, the method comprising the steps of:

providing a radiant energy beam from the radiation source for joining the first article and the second article at the interfacial surface;

controlling a depth of focus of the radiant energy beam as a function of the composition of the first article and the composition of the second article, the depth of focus corresponding to a depth of a joint between the first article and the second article at the interfacial surface, expanding the radiant energy beam in a first direction;

contracting the radiant energy beam in a second direction, the second direction being substantially perpendicular to the first direction; and passing the radiant energy beam towards the interfacial surface after said steps of expanding and contracting.

8. The method of claim 7 wherein said step of providing includes generating said radiant energy beam to have a wavelength center as a function of the composition of the first article and the composition of the second article.

9. The method of claim 7 wherein said first article and said second article comprise a substantially identical media.

10. The method of claim 7 wherein said first article and said second article comprise a transparent media, the transparent media having a transparency range between 1% and 99%.

11. The method of claim 7 wherein said step of controlling a depth of focus includes controlling chromatic aberrations of said radiant energy beam.

12. The method of claim 7 wherein said step of controlling a depth of focus includes controlling spherical aberrations of said radiant energy beam.

* * * * *